(12) United States Patent
Bream et al.

(10) Patent No.: US 6,225,571 B1
(45) Date of Patent: May 1, 2001

(54) HEATSINK WITH HIGH THERMAL CONDUCTIVITY DIELECTRIC

(75) Inventors: Jeffrey L. Bream, Bethlehem, PA (US); Stephen A. Ferranti, Rowlett, TX (US); Madhu Ganesa-Pillai, Dallas, TX (US); Leon Klafter, Allen, TX (US); Alan M. Lyons, New Providence, NJ (US); John Paul Mello, Dallas; Steven J. Vargo, Midlothian, both of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/252,741

(22) Filed: Feb. 19, 1999

(51) Int. Cl.⁷ .............. H05K 1/18; H05K 1/09; H05K 3/30
(52) U.S. Cl. .......... 174/260; 174/16.3; 174/252; 361/705; 361/707; 361/708; 165/80.2; 165/185; 165/80.3; 257/707; 257/713; 257/717
(58) Field of Search .............. 174/260, 16.3, 174/252; 361/708, 707, 704, 705, 719, 720; 165/80.2, 80.3, 185; 257/707, 713, 717

(56) References Cited

U.S. PATENT DOCUMENTS

| | | | |
|---|---|---|---|
| 5,146,981 | * | 9/1992 | Samarov .................. 165/185 |
| 5,344,795 | * | 9/1994 | Hashemi et al. ............. 264/272.15 |
| 5,533,256 | * | 7/1996 | Call et al. .................. 29/840 |
| 5,616,888 | * | 4/1997 | McLaughlin et al. ............. 174/260 |
| 5,757,073 | * | 5/1998 | Hoffmeyer .................. 257/700 |
| 5,931,222 | * | 8/1999 | Toy et al. .................. 165/80.3 |
| 6,011,299 | * | 1/2000 | Brench .................. 257/660 |
| 6,021,044 | * | 2/2000 | Neville, Jr. et al. .................. 361/700 |
| 6,084,775 | * | 7/2000 | Bartley et al. .................. 361/705 |
| 6,085,833 | * | 7/2000 | Kimura et al. .................. 165/185 |
| 6,088,226 | * | 7/2000 | Rearick .................. 361/704 |
| 6,154,369 | * | 11/2000 | Martinez, Jr. et al. .................. 361/719 |

\* cited by examiner

*Primary Examiner*—Jeffrey Gaffin
*Assistant Examiner*—Ishwar B. Patel

(57) ABSTRACT

The present invention provides a heatsink for use with a heat-generating electrical component. The heatsink comprises a spine having opposing sides, cooling fins extending from the spine, and a dielectric layer adhered to at least one of the opposing sides. The dielectric layer has a thermal conductivity of at least about 1 W/m° C. The heatsink may further comprise a metal layer adhered to the dielectric layer. The metal layer provides a surface to which an electric component can be adhered. The heatsink can further include a heat-generating component adhered to the metal layer. In another aspect, the heat-generating component is a surface-mount electrical component adhered to the metal layer with solder.

16 Claims, 3 Drawing Sheets

HEATSINK WITH HIGH THERMAL CONDUCTIVITY DIELECTRIC

TECHNICAL FIELD OF THE INVENTION

The present invention is directed, in general, to a heatsink and, more specifically, to a heatsink having an insulating dielectric with a high thermal conductivity.

BACKGROUND OF THE INVENTION

Because of the ever increasing demand placed on electrical components, in general, electronic designers need to be able to pack higher powered components closer together in ever smaller spaces. More power in less space translates to higher watt densities, and therefore, increased heat generation. As temperatures rise, the reliability and functionality of electronic components are impaired dramatically. Experience has shown that more than 50 percent of electronic failures are the result of thermal problems. Traditionally, heatsinks are used to move heat from components generating the heat to an area where the heat can be dissipated to the atmosphere or adequate ventilation can be provided to the heatsink.

Conventional heatsinks use some type of mechanical method to attach the heat-generating component to the heatsink. The most common methods are: adhesives, spring clamping devices, or hold-down brackets with a mechanical fastener such as a machine screw. These methods generally require an assembler to make the mechanical attachment of the component to the heatsink.

Heat-generating electronic devices need to be electrically isolated from the heatsink in many cases. Currently the devices are electrically isolated by a thermal interface pad, which results in a substantial thermal contact resistance. Typically, in a stamped heatsink assembly, the presence of the thermal interface pad can contribute up to 50 percent of the overall thermal resistance, even in the best designs. However, heat generating devices may be directly mounted on the heatsink. In at least one conventional approach, the entire heatsink is covered with a dielectric material prior to mounting the device on an intervening metal foil layer. By covering unnecessary areas of the heatsink with the dielectric, the thermal efficiency of forced convection cooling is significantly reduced. When the device is surface mounted, the contact resistance is very low, because of the metal to metal bond between the tab of the device and the metal foil substrate.

There are additional thermal transfer inefficiencies associated with the way in which components are conventionally attached to the heatsink. Although the component surface and the mating surface appear to be smooth, under adequate magnification it can be shown that they are actually rough. When a heatsink is mated with a heat-generating device by a mechanical means such as a spring clamp or hold-down bracket, microscopic peaks in the surface of the component ride upon corresponding microscopic peaks of the heatsink. Therefore, the two surfaces are not in the close physical proximity that fosters good heat transference by conduction. Of course, this poor thermal conductivity results in higher device temperatures which, in turn, lead to device failures. Alternatively, adhesives are often used to adhere the electrical component to the heatsink; however, these conventional adhesives also bring disadvantages. For example, while these adhesives often have good dielectric characteristics, they are not good thermal conductors, or, if they are good thermal conductors, they tend to have poor dielectric characteristics. Thus, these present day adhesives do have undesirable characteristics.

Accordingly, what is needed in the art is a heatsink with a low thermal impedance between the electronic component and the body of the heatsink while maintaining good dielectric characteristics and eliminating mechanical fasteners.

SUMMARY OF THE INVENTION

To address the above-discussed deficiencies of the prior art, the present invention provides a heatsink for use with a heat-generating electrical component. The heatsink comprises a spine having opposing sides, cooling fins extending from the spine, and a dielectric layer adhered to at least one of the opposing sides. The dielectric layer has a thermal conductivity of at least about 1 W/m° C. In one embodiment, the heatsink further comprises a metal layer adhered to the exposed surface of the dielectric layer. The metal layer is preferably adhered to exposed surface of the dielectric layer without the use of conventional adhesives that are typically used to adhere electrical components to heatsinks. Thus, the problems associated with the use of such conventional adhesives are avoided. Once attached to the dielectric layer, the metal layer provides a surface to which an electric component can be attached. In another aspect of this embodiment, the heatsink further includes a heat-generating component adhered or attached to the metal layer. In a particularly advantageous embodiment, the heat-generating component is a surface-mount electrical component that is adhered to the metal layer with solder.

In another embodiment, the metal layer is patterned to form concentric patterns on the dielectric layer to provide a mounting location for electrical components having mounting footprints of different sizes. These concentric patterns can be used as a self-aligning mark for easily placing or positioning the electrical components on the metal layer. In one aspect of this embodiment, the metal layer forms at least three concentric patterns to accommodate any of three different sizes of electrical components. In a particularly advantageous embodiment, the concentric patterns provide a self-aligning pattern for adhering a surface-mountable electrical component thereon during a soldering process.

In another embodiment, the electrical component has electrical leads extending therefrom with each of the electrical leads configured to be received in a corresponding contact opening within a printed wiring board. The self-aligning pattern aligns each of the electrical leads with one of the corresponding contact openings, respectively.

In yet another embodiment, the heatsink further includes a heat-generating component adhered to the dielectric layer. The dielectric layer, in particularly advantageous embodiments, comprises material with a thermal conductivity ranging from about 2 W/m° C. to about 15 W/m° C.

The dielectric layers may be adhered to each of the opposing sides with a metal layer being adhered to each of the dielectric layers. In one aspect of this particular embodiment, the heatsink has an electrical component adhered to each of the metal layers.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
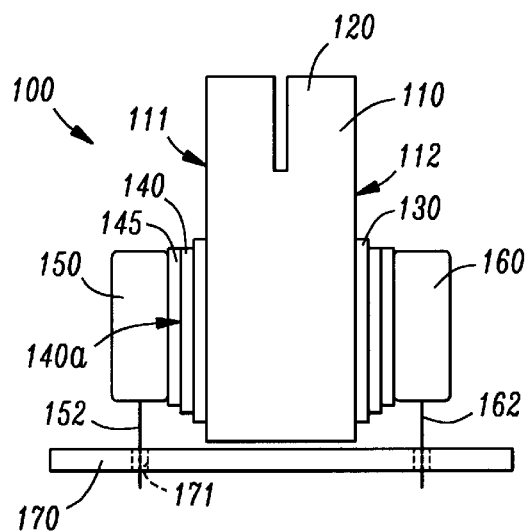
FIG. 1 illustrates an end elevational view of one embodiment of a heatsink constructed according to the principles of the present invention.

Referring initially to FIG. 1, illustrated is an end elevational view of one embodiment of a heatsink constructed according to the principles of the present invention. A heatsink, generally designated 100, comprises a spine 110, cooling fins 120, a dielectric layer 130, and a metal layer 140. Also shown are heat-generating devices 150, 160, with contact leads 152, 162, through contact openings 171 in a printed wiring board (PWB) 170.

The spine 110 may be constructed of any suitable material, most commonly aluminum, copper, steel or other excellent thermal conducting materials. In an alternative embodiment, the spine 110 may be of aluminum and comprise surfaces 111, 112 that have been treated to improve adhesion between the spine 110 and the dielectric layer 130. This surface treatment may be accomplished by chemical cleaning, grit blasting, etching, or anodizing. Adhesion is an important issue in this application due to the CTE (coefficient of thermal expansion) mismatch between the aluminum spine 110 (24 ppm) and the copper-based metal layer 140 (17 ppm). One who is skilled in the art will recognize that because of the different CTEs, differing peel stresses will occur during thermal cycling at the aluminum spine 110 and dielectric layer 130 junction than at the metal layer 140 and the dielectric layer 130 junction. The durability of the adhesive bond strength increases as the selected surface treatment process moves from cleaning to grit blasting to etching to anodization. For an ac-dc rectifier application where the module typically runs warm and in an indoor environment, grit blasting the aluminum should be sufficient to achieve good reliability. However, grit blasting the surface, although an inexpensive process, leaves the aluminum fins untreated and subject to oxidation and corrosion. A high purity aluminum alloy, which is preferably >99% pure aluminum, is inherently corrosion resistant. Other less pure alloys would necessitate a surface treatment to inhibit corrosion. Any anodization process will both improve adhesion and prevent corrosion.

Another group of aluminum surface treatments commonly used to prevent corrosion are called conversion coatings. Among commercially available conversion coatings are Irridite™ and Alodine™. Most are chromate-based coatings; however, to avoid the use of carcinogenic chromium solutions, non-chromate based conversions coatings, such as Alodine 2000, Alodine 300+Deoxylyte® and Alodine™ 5200, are now available and may be used in place of the chromate-based conversion coatings. All of these coatings have been shown to protect aluminum surfaces from corrosion.

Therefore, in a specific embodiment, the spine 110 may be anodized aluminum. Anodizing is a low-cost metal treatment that improves chemical resistance of the aluminum to acidic solutions, improves bond strength of the dielectric layer 130, and provides an added layer of dielectric isolation between the devices 150, 160 and the spine 110. The cooling fins 120 may be of any design that presents the desired surface area for heat dissipation. In the illustrated embodiment, the dielectric layer 130 and metal layer 140 have been applied to the surface of opposing sides 111, 112 of the spine 110. One who is skilled in the art will recognize that the heatsink may also be constructed with a dielectric layer 130 and metal layer 140 on only one side. The dielectric layer 130 preferably has a thermal conductivity of at least about 1 W/m° C. In an alternative embodiment, however, the dielectric layer 130 may have a thermal conductivity ranging from about 2 W/m° C. to about 15 W/m° C. For example, one dielectric material presently available is T-preg™, which has a thermal conductivity of about 8 W/m° C. It is also highly desirable that the dielectric layer 130 have good dielectric characteristics as well. For example, it is desirable that the dielectric layer 130 have a dielectric strength of about 2500 V. The heat-generating devices 150, 160 may be surface mounted to an exposed surface 140a of the metal layer 140 by a solder layer 145. When molten, solder fills the microscopic voids between the irregular surfaces of the metal layer 140 and the heat-generating device 150, thereby improving surface-to-surface thermal transmission. In this particular embodiment, the use of solder in place of the conventional adhesion systems discussed above substantially improves the thermal conductance between the metal layer 140 and the heat-generating device 150 due to the molten solder's ability to fill the microscopic voids.

Figure 2:
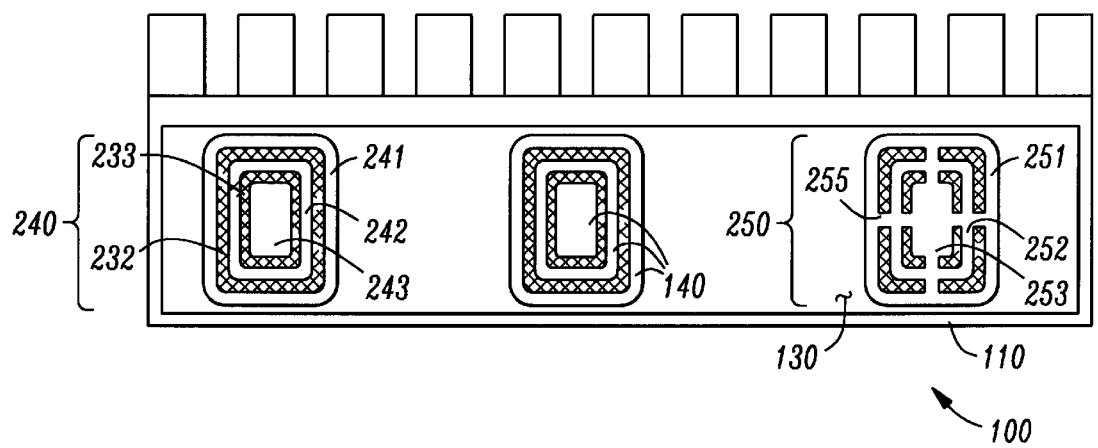
FIG. 2 illustrates a side view of the heatsink of FIG. 1.

Referring now to FIG. 2, illustrated is a side view of the heatsink of FIG. 1. Shown in this view of the heatsink 100 are alternative forms of concentric patterns 240, 250, formed from the metal layer 140 that is adhered to the spine 110. To form concentric pattern 240, the metal layer 140 may be formed as a continuous layer on the dielectric layer 130. Of course, the number of sites 240, 250 are dependent upon the number and sizes of components. The metal layer 140 may then be photolithographically etched using conventional methods to form pattern 240 with dielectric areas 232, 233 exposed between adjacent concentric metallic patterns 241, 242, 243. Photolithography enables the formation of all types of circuit designs, including those with small, isolated traces. Photolithography also enables some circuitry to be moved from the PWB to the heatsink, saving useful area on the PWB. However, in the photolithography process, as one who is skilled in the art will understand, acid is used to etch away unprotected copper areas of the metal layer 140. In this process, exposed aluminum of the heatsink is subjected to an acidic environment that will rapidly erode it. Thus, the key to effectively implementing photolithography is to protect exposed aluminum surfaces prior to copper layer 140 lamination. This can be achieved by anodizing the aluminum as described above, and sealing the surface with a combination of nickel acetate and chromic acid. Alternatively, the aluminum may be sealed with steam, triethanolamine, sodium silicate, etc. A discussion of sealing may be found in *The Surface Treatment and Finishing of Aluminum and Its Alloys*, 5th Ed., Vol. 2, Chapter 11, "Sealing Anodic Oxide Coatings," pg. 773–856, incorporated herein by reference.

However, it may be desirable to form the metal layer 140 separately as concentric pattern 250 comprising patterns 251, 252, 253 and then affix them to the dielectric layer 130. Concentric patterns 240 and 250 differ by the absence or presence of interconnects 255. The interconnects 255 maintain precise spacing between patterns 251, 252, and 253 during the application of concentric pattern 250 to the dielectric layer 130. This approach is commonly achieved by stamping the patterns 250 from a sheet with a lead frame (not shown). One who is skilled in the art is familiar with lead frame technology. As described above, concentric pattern 240 is formed by etching away the metal layer 140 from areas 232, 233, the interconnects 255 are not required. Of course, the number of concentric patterns 240, 250 that may be formed on the heatsink is dependent upon the size and number of components and the size of the heatsink. For example, a three inch long heatsink may have up to three mounting sites on one side for components with T0 218, T0 220 and T0 247 package sizes.

Figure 3A:
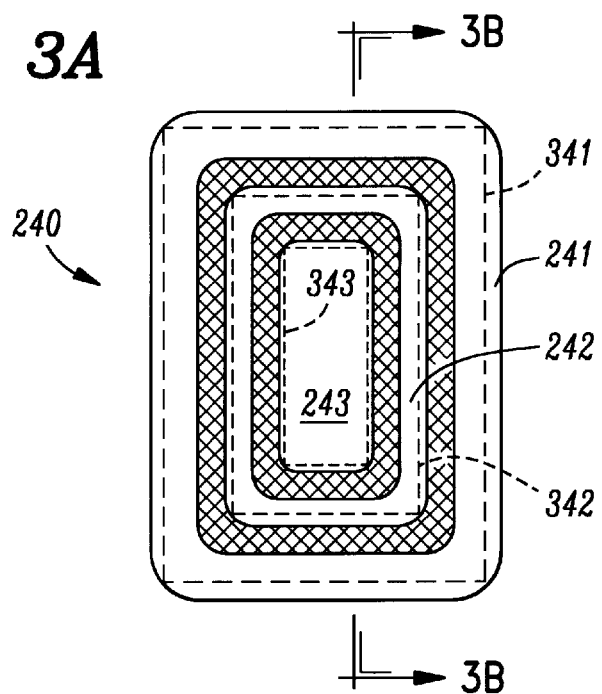
FIG. 3A illustrates a plan view of three standard sizes of components affixed to the concentric patterns of the heatsink of FIG. 1.

Referring now to FIG. 3A with continuing reference to FIG. 1, illustrated is a plan view of three standard sizes of components affixed to the concentric patterns of the heatsink of FIG. 1. In the illustrated embodiment, the essentially-rectilinear, concentric patterns 240, 250 are sized to accept surface mounting of three standard sizes 341, 342, 343 (dashed lines) of electrical components. Each size fits precisely to a surface mounting area offered by one of the patterns 241, 242, 243, respectively. Of course, the number of concentric patterns 241, 242, 243, may be as few as two or as many as the physical area allows. Similarly, a single pattern may also be formed. One who is skilled in the art will understand that other standard sizes of electrical components may likewise be nested in concentric patterns. When heat-generating devices 150, 160 are soldered to the patterned metal layer 140, the devices 150, 160 self-align with the appropriate size pattern 241, 242, or 243 during the time that the solder 145 is molten. The self-alignment property of the surface mount process is well known to those who are skilled in the art. Thus, precision placement of the concentric patterns 240, 250 on the dielectric layer 130 assures that contact leads 152 or 162 are properly positioned to cooperatively engage contact openings 171 in the printed wiring board 170. One who is skilled in the art will recognize that while the illustrated embodiment incorporates wiring through the printed wiring board 170, the present invention is also applicable to surface mount technology wherein the leads 152, 162 may be adapted to cooperate with mating pads (not shown) on the printed wiring board 170.

Figure 3B:
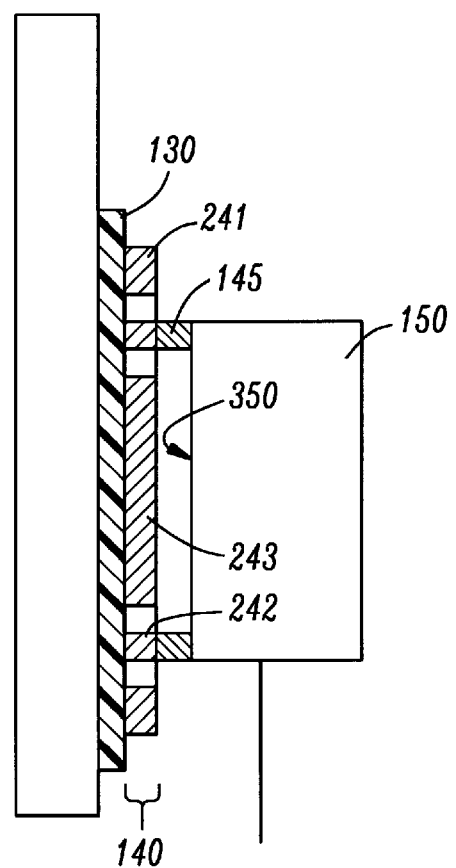
FIG. 3B illustrates a partial sectional view of a heat-generating device and heatsink of FIG. 3A along line 3B—3B.

Referring now to FIG. 3B, illustrated is a partial sectional view of a heat-generating device and heatsink of FIG. 3A along line 3B—3B. As can be seen, the solder layer 145 under the heat-generating device 150 conforms to a surface-mount face 350 of the heat-generating device 150 and the pattern 242. Also shown for clarity are patterns 241 and 243. Because the solder 145 adheres only to the thin metal layer 140 and not to the dielectric layer 130, the surface tension of the solder 145 during its molten state automatically aligns the device 150 to the pattern 242. Therefore each size of device 150, 160 automatically aligns to the appropriate pattern 241, 242, or 243.

Figure 4:
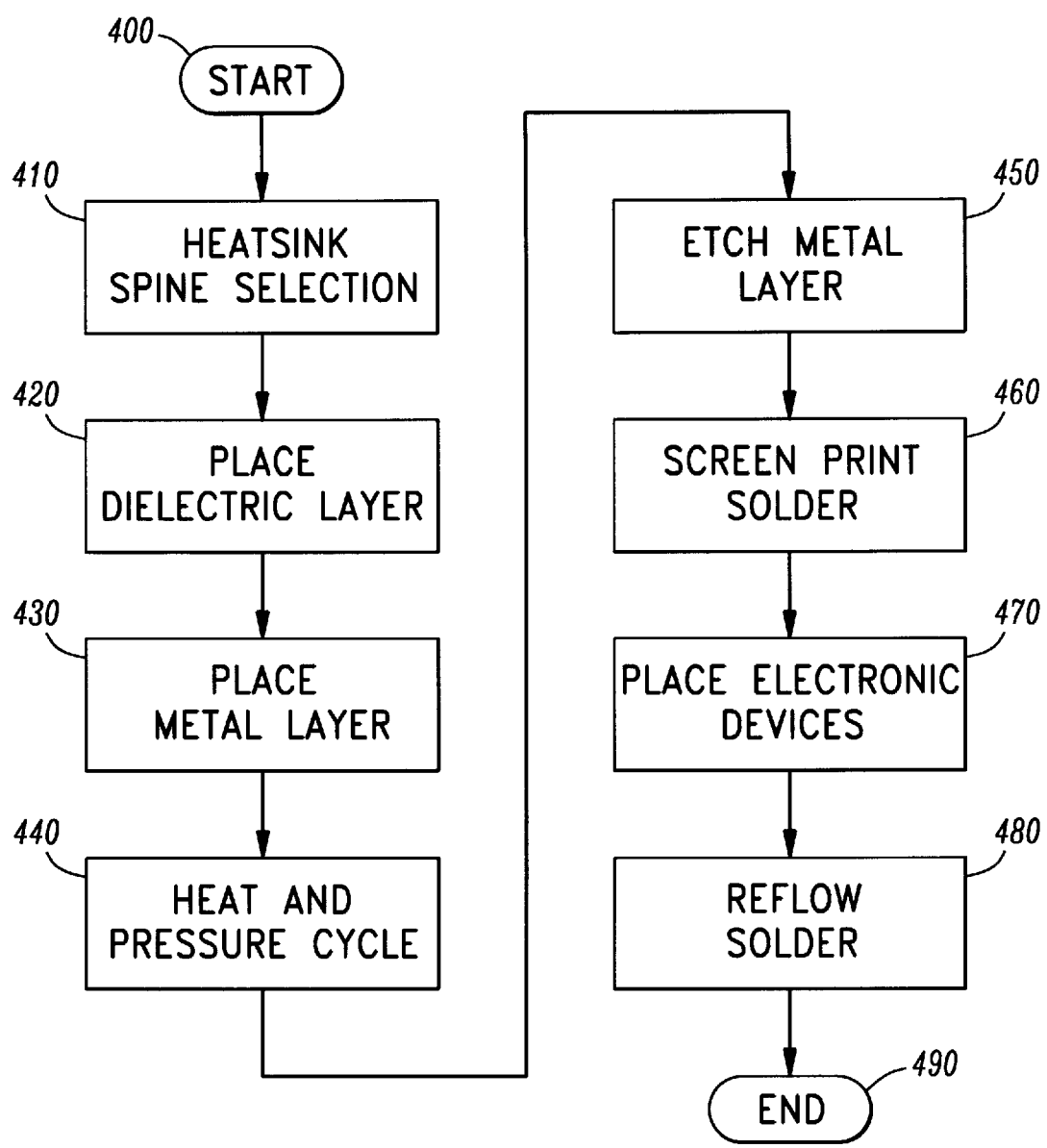
FIG. 4 illustrates a flow diagram showing the various operations conducted during manufacture and assembly of the heatsink and components illustrated in FIGS. 1 and 2.

Turning now to FIG. 4 with continuing reference to FIGS. 1 and 2, there is illustrated a flow diagram showing the various operations conducted during manufacture and assembly of one embodiment of the heatsink and components illustrated in FIGS. 1 and 2. As shown, the process starts at 400. At 410, a heatsink spine 110 is selected. In a specific embodiment, the spine 110 may be a coupon of anodized and sealed aluminum alloy 1100 H14, having dimensions of 2"×3"×0.25". The dielectric layer 130 is placed on a side 111 of the spine 110 at 420. The dielectric layer 130 may be, for example of T-Preg™, about one inch width placed along a long edge of the heatsink spine 110. Of course, one who is skilled in the art will readily observe that other similar materials may also be used. At 430, the metal layer 140 is placed on the dielectric layer 130. The metal layer 140 may be copper foil of about one inch width. The assembly 100 is subjected to heat of 170° C. and pressure of 200 psi for 45 minutes to affix the metal layer 140 and dielectric layer 130 to the spine 110 at 440. As previously discussed, an additional dielectric layer 130 and an additional metal layer 140 may be affixed, if required, to the reverse side 112 of the spine 110 by appropriately repeating 420, 430 before 440. Of course, as one who is skilled in the art will readily observe, the metal layers 140 may be laminated simultaneously, which would be preferred if the geometry permits.

At 450, the metal layer 140 is lithographically defined and conventionally etched to form concentric patterns 240. In a particularly advantageous embodiment, the copper metal layer 140 is etched to remove the copper 140 a distance of 0.12" from the edge of the dielectric layer 130. It has been found that the dielectric layer 140 thickness tapers toward its edges from a central thickness of about 0.008" to 0.009" down to a thickness of about 0.002" over the peripheral 0.12". Thus, removing the copper metal layer 140 over the peripheral 0.12" insures planarity of the copper foil 140 and avoids insufficient dielectric thickness between the device and the spine 110. Solder is then screen printed to selected patterns 241, 242, 243 on the heatsink 100 at 460. At 470, heat-generating devices 150, 160 are placed over selected patterns 241, 242, 243 of the heatsink 100. The heatsink 100 and the heat-generating devices 150, 160 are subjected to a heating cycle to reflow the solder 145 at 480. The process ends at 490. Thus, a high thermal conductivity dielectric has been interposed between a heatsink spine 110 and a conductive metal layer 140 thereby eliminating conventional mechanical fasteners. This provides: improved dielectric strength, enables conventional surface-mount technology assembly and repair processes, and accurately locates components for subsequent mounting to a PWB. Photolithography has the additional advantage of enabling some circuitry to be moved from the PWB onto the heatsink, thus freeing area of the PWB.

Although the present invention has been described in detail, those skilled in the art should understand that they can make various changes, substitutions and alterations herein without departing from the spirit and scope of the invention in its broadest form.

What is claimed is:

1. For use with a heat-generating electrical component, a heatsink, comprising:
   a spine having opposing sides;
   cooling fins extending from said spine;
   a dielectric layer adhered to at least one of said opposing sides; and
   a metal layer adhered to said dielectric layer, said metal layer including concentric patterns on said dielectric layer to provide mounting locations for electrical components having mounting footprints of different sizes.

2. The heatsink as recited in claim 1 further comprising a heat-generating component adhered to said metal layer.

3. The heatsink as recited in claim 3 wherein said heat-generating component is a surface-mount electrical component adhered to said metal layer with solder.

4. The heatsink as recited in claim 1 wherein said metal layer forms at least two concentric patterns.

5. The heatsink as recited in claim 1 wherein each of said concentric patterns provides a self-aligning pattern for adhering a surface-mountable electrical component thereon during a soldering process.

6. The heatsink as recited in claim 5 wherein said electrical component has electrical leads extending therefrom with each of said electrical leads configured to be received in a corresponding contact opening within a printed wiring board, said self-aligning pattern aligning each of said electrical leads with one of said corresponding contact openings, respectively.

7. The heatsink as recited in claim 1 further comprising a heat-generating component adhered to said dielectric layer.

8. The heatsink as recited in claim 1 wherein a thermal conductivity of said dielectric layer ranges from about 1 W/m° C. to about 15 W/m° C.

9. The heatsink as recited in claim 1 further comprising dielectric layers adhered to each of said opposing sides and a metal layer adhered to each of said dielectric layers.

10. The heatsink as recited in claim 9 further comprising an electrical component adhered to each of said metal layers.

11. A printed wiring board, comprising:
   electrical components mounted on and electrically connected to said printed wiring board; and
   a heatsink mounted on said printed wiring board and including:
      a spine having opposing sides;
      cooling fins extending from said spine;
      a dielectric layer adhered to at least one of said opposing sides;
      a metal layer adhered to said dielectric layer, said metal layer including concentric patterns on said dielectric layer to provide self-aligning mounting locations for electrical components having mounting footprints of different sizes; and
      a heat generating electrical component adhered to said metal layer, said electrical component having electrical leads extending therefrom by which said electrical component can be electrically connected to said printed wiring board.

12. The printed wiring board as recited in claim 11 wherein said printed wiring board includes contact openings formed therein and each of said electrical leads is configured to be received in a corresponding one of said contact openings, said self-aligning pattern aligning each of said electrical leads with said one of said corresponding contact openings, respectively.

13. The printed wiring board as recited in claim 11 wherein said heat-generating component is a surface-mount electrical component adhered to said metal layer with solder.

14. The printed wiring board as recited in claim 11 wherein said metal layer forms at least two concentric patterns.

15. The printed wiring board as recited in claim 11 wherein each of said concentric patterns provides a self-aligning pattern for aligning said electrical leads to an electrical contact point on said printed wiring board.

16. The printed wiring board as recited in claim 11 wherein a thermal conductivity of said dielectric layer ranges from about 1 W/m° C. to about 15 W/m° C.

* * * * *